United States Patent
Yao et al.

(10) Patent No.: US 11,201,120 B2
(45) Date of Patent: Dec. 14, 2021

(54) DISPLAY HAVING AN AMORPHOUS SILICON LIGHT SHIELD BELOW A THIN FILM TRANSISTOR

(71) Applicant: BOE Technology Group Co., Ltd., Beijing (CN)

(72) Inventors: Qi Yao, Beijing (CN); Zhanfeng Cao, Beijing (CN); Feng Zhang, Beijing (CN); Jiushi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 426 days.

(21) Appl. No.: 16/070,271

(22) PCT Filed: Dec. 14, 2017

(86) PCT No.: PCT/CN2017/116141
§ 371 (c)(1),
(2) Date: Jul. 13, 2018

(87) PCT Pub. No.: WO2018/196399
PCT Pub. Date: Nov. 1, 2018

(65) Prior Publication Data
US 2021/0013153 A1    Jan. 14, 2021

(30) Foreign Application Priority Data
Apr. 28, 2017    (CN) .......................... 201710299861.8

(51) Int. Cl.
| H01L 23/552 | (2006.01) |
| H01L 21/02 | (2006.01) |
| H01L 21/3213 | (2006.01) |
| H01L 27/12 | (2006.01) |

(Continued)

(52) U.S. Cl.
CPC ...... *H01L 23/552* (2013.01); *H01L 21/02532* (2013.01); *H01L 21/02592* (2013.01);
(Continued)

(58) Field of Classification Search
CPC ... H01L 29/786–78696; H01L 27/1214–1296; H01L 29/66757; H01L 23/552
See application file for complete search history.

(56) References Cited

U.S. PATENT DOCUMENTS 5,605,847 A * 2/1997 Zhang ............... G02F 1/136209
                                                           438/164
2003/0025848 A1    2/2003 Sera et al.
(Continued)

FOREIGN PATENT DOCUMENTS

| CN | 1402538 A | 3/2003 |
| CN | 1519631 A | 8/2004 |

(Continued)

OTHER PUBLICATIONS

International Search Report and Written Opinion issued in corresponding International Patent Application No. PCT/CN2017/116141, dated Mar. 23, 2018.

*Primary Examiner* — Kevin Parendo
(74) *Attorney, Agent, or Firm* — McDermott Will & Emery LLP (57) ABSTRACT

In embodiments of the present disclosure, there is provided a display substrate assembly including: a base substrate; a light shielding layer on the base substrate; and an active layer of a thin film transistor, above the base substrate. An orthographic projection of the active layer on the base substrate in a thickness direction of the base substrate is within an orthographic projection of the light shielding layer on the base substrate in the thickness direction of the base substrate, and the light shielding layer includes an ion-doped amorphous silicon layer. In embodiments of the present disclosure, there is also provided a method of manufacturing a display substrate assembly and a display apparatus including the display substrate assembly.

19 Claims, 5 Drawing Sheets

(51) Int. Cl.
*H01L 29/66* (2006.01)
*H01L 29/786* (2006.01)

(52) U.S. Cl.
CPC .. *H01L 21/02667* (2013.01); *H01L 21/32139* (2013.01); *H01L 27/1222* (2013.01); *H01L 27/1262* (2013.01); *H01L 27/1274* (2013.01); *H01L 29/66757* (2013.01); *H01L 29/78609* (2013.01); *H01L 29/78633* (2013.01); *H01L 29/78675* (2013.01)

(56) References Cited

U.S. PATENT DOCUMENTS

| | | | |
|---|---|---|---|
| 2004/0149989 A1 | 8/2004 | Matsunaga et al. | |
| 2009/0014721 A1* | 1/2009 | Tanabe | H01L 29/78633 257/59 |
| 2014/0183521 A1 | 7/2014 | Hsu et al. | |
| 2015/0311350 A1* | 10/2015 | Huang | H01L 29/78675 257/66 |
| 2016/0133473 A1 | 5/2016 | Wang et al. | |
| 2017/0301705 A1* | 10/2017 | Hu | H01L 29/78621 |

FOREIGN PATENT DOCUMENTS

| | | |
|---|---|---|
| CN | 101022085 A | 8/2007 |
| CN | 101692439 A | 4/2010 |
| CN | 103904128 A | 7/2014 |
| CN | 104409512 A | 3/2015 |
| CN | 105374749 A | 3/2016 |
| CN | 107104110 A | 8/2017 |
| CN | 107316906 A | 11/2017 |
| JP | 2008-166573 A | 7/2008 |
| KR | 10-2006-0001753 A | 1/2006 |

* cited by examiner

DISPLAY HAVING AN AMORPHOUS SILICON LIGHT SHIELD BELOW A THIN FILM TRANSISTOR

This application claims priority to Chinese Patent Application No. 201710299861.8 filed on Apr. 28, 2017 in the State Intellectual Property Office of China, the disclosures of which are hereby incorporated by reference in their entirety.

TECHNICAL FIELD

Embodiments of the present disclosure generally relates to the field of display technology, and particularly, to a display substrate assembly, a method of manufacture the display substrate assembly, and a display apparatus comprising the display substrate assembly.

BACKGROUND

Currently, Thin Film Transistor (TFT) is widely used in the display substrate assembly of various display apparatuses. The active layer of the TFT is generally made of amorphous silicon (a-Si) material with good stability and processability, however, due to the inherent defects of the amorphous silicon itself, such as low on-state current, low mobility, poor stability and so on, it has been limited in many fields of application. In order to make up for the defects of amorphous silicon itself and expand its application in related fields, Low Temperature Poly-Silicon (LTPS) technology has emerged. A display apparatus using the LTPS process has a high electron mobility, can effectively reduce the area of the TFT to increase the aperture ratio of the pixel, and can reduce the power consumption and the production cost while enhancing the display luminance, so it has become a research hotspot in the display field.

SUMMARY

The present disclosure has been made to overcome or eliminate at least one of problems and defects existing in the prior art.

According to an aspect of the present disclosure, there is provided a display substrate assembly, comprising:
a base substrate;
a light shielding layer on the base substrate; and
an active layer of a thin film transistor, above the base substrate;
wherein an orthographic projection of the active layer on the base substrate in a thickness direction of the base substrate is within an orthographic projection of the light shielding layer on the base substrate in the thickness direction of the base substrate, and the light shielding layer comprises an ion-doped amorphous silicon layer.

In some embodiment, the display substrate assembly further comprises:
a buffer layer on the base substrate;
a first insulating layer on the buffer layer; and
a second insulating layer on the light shielding layer;
wherein, the light shielding layer is between the first insulating layer and the second insulating layer, and the second insulating layer is between the light shielding layer and the active layer.

In some embodiments, orthogonal projections of the buffer layer, the active layer, the first insulating layer, the light shielding layer and the second insulating layer on the base substrate in the thickness direction of the base substrate are completely overlapped.

In some embodiments, the buffer layer, the first insulating layer, the light shielding layer, the second insulating layer and the active layer are stacked on the base substrate in that order from the bottom to the top.

In some embodiments, the light shielding layer has a thickness of 500 Å to 1600 Å.

In some embodiments, a pattern of the light shielding layer has a thickness of 900 Å to 1600 Å.

In some embodiments, the light shielding layer comprises an amorphous silicon layer doped with boron ions or phosphorus ions.

In some embodiments, the active layer comprises polysilicon material.

In some embodiments, the buffer layer comprises silicon nitride material.

In some embodiments, the buffer layer has a thickness of 200 Å to 1000 Å.

In some embodiments, the first insulating layer and the second insulating layer comprise silicon oxide material.

In some embodiments, the first insulating layer has a thickness of 500 Å to 3000 Å, and the second insulating layer has a thickness of 1000 Å to 4000 Å.

According to another aspect of the present disclosure, there is provided a display apparatus comprising the display substrate assembly of any one of the abovementioned embodiments.

According to yet another aspect of the present disclosure, there is provided a method of manufacturing a display substrate assembly, the method comprising:
providing a base substrate;
providing a base substrate; and
forming an active layer of a thin film transistor and a light shielding layer above the base substrate so that an orthographic projection of the active layer on the base substrate in a thickness direction of the base substrate is within an orthogonal projection of the light shielding layer on the base substrate in the thickness direction of the base substrate, and the light shielding layer is formed of an ion-doped amorphous silicon layer.

In some embodiments, the method further comprises:
forming a buffer layer, a layer of first insulating material, a layer of second insulating material and a layer of semiconductor material, on the base substrate; and
patterning, with one mask, the layer of first insulating material, the ion-doped amorphous silicon layer, the layer of second insulating material and the layer of semiconductor material, to form a first insulating layer, the light shielding layer, a second insulating layer and the active layer, respectively.

In some embodiments, the step of forming a buffer layer, a layer of first insulating material, the light shielding layer, a layer of second insulating material and a layer of semiconductor material, on the base substrate, comprises:
forming the buffer layer on the base substrate;
forming the layer of first insulating material on the buffer layer;
forming a first amorphous silicon layer on the layer of first insulating material;
forming the layer of second insulating material on the first amorphous silicon layer;
forming a second amorphous silicon layer on the layer of second insulating material;
implementing an ion doping on the first amorphous silicon layer, and annealing the first ion-doped amorphous silicon layer, to form the light shielding layer; and annealing the second amorphous silicon layer to convert the second amorphous silicon layer into a polysilicon layer as the layer of semiconductor material.

In some embodiments, the step of patterning, with one mask, the layer of first insulating material, the ion-doped amorphous silicon layer, the layer of second insulating material and the layer of semiconductor material, comprises:

forming a pattern of photoresist on the layer of semiconductor material with the one mask;

etching, by using the pattern of photoresist as a mask in an etching process, the layer of first insulating material, the ion-doped amorphous silicon layer, the layer of second insulating material, and the layer of semiconductor material, to form the first insulating layer, the light shielding layer, the second insulating layer, and the active layer, respectively; and stripping off the photoresist.

In some embodiments, the layer of first insulating material and the layer of second insulating material are etched, etch rates of the layer of first insulating material and the layer of second insulating material are approximately the same.

In some embodiments, the step of implementing an ion doping on the first amorphous silicon layer, comprises:

implanting, by adopting ion implantation process parameters including a voltage of 30 KV and an ion implantation dose of 5E14 to 9E14, boron ions or phosphorus ions into the first amorphous silicon layer.

In some embodiments, the buffer layer is formed of silicon nitride.

In some embodiments, the layer of first insulating material and the layer of second insulating material are formed of silicon oxide.

BRIEF DESCRIPTION OF THE DRAWINGS

These and/or other objectives and advantages of the present disclosure will become apparent and more readily appreciated from the following description of the present disclosure with reference to the accompanying drawings, and can help to provide a thorough understanding of the present disclosure.

DETAILED DESCRIPTION OF THE EMBODIMENTS

Technical solutions according to the present disclosure will be described hereinafter in detail and completely through the embodiments and with reference to the attached drawings. The same or similar reference numerals throughout the description refer to the same or similar elements. These embodiments of the present disclosure described hereinafter with reference to the attached drawings are provided to explain general inventive concept of the present disclosure, but not to be regarded as limiting the present disclosure.

Further, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

It will be noted that, when an element or layer is referred to as being "on" another element or layer, it can be directly on the other element or intervening layer(s) may be present. In addition, it will be understood that, when an element or layer is referred to as being "under" another element or layer, it can be directly beneath the other element or layer, or there may be more than one intervening layer or element. In addition, it will also be understood that, when a layer or element is referred to as being "between" two layers or two elements, it can be a unique layer between the two layers or two elements, or more than one intervening layer or element may also be present. Also, the terms "first", "second", and the like are used herein for descriptive purposes only and are not to be construed as indicating or implying relative importance.

It should also be noted that, due to very small size of each of structures included in the embodiments of the present disclosure, for the sake of clarity, dimensions and proportions of the structures in the drawings according to the embodiments of the present disclosure do not represent actual dimensions and proportions.

LTPS TFT generally employs a top-gate structure. However, in a TFT of top-gate structure, a light shielding layer is generally formed prior to an active layer in order to prevent light from the backlight source from directly irradiating a back channel to generate a leakage current. At present, metal materials such as metal Mo are usually used to form the light shielding layer. When manufacturing such LPTS TFTs, a mask is generally used to form a pattern of the light shielding layer by a single patterning process, and then another patterning process is adopted to form patterns of other layers, including the active layer, of the TFT, increasing the number of times of the patterning process. Thereby, the current LTPS TFT manufacturing method is much complicated, and has increased production costs. Meanwhile, in the manufacturing process of the LPTS TFT, the pattern of the light shielding layer has been formed before the amorphous silicon is converted into polysilicon (p-Si). Generally, due to the limitation of the patterning process, the formed pattern of the light shielding layer will form a certain slope angle at the edge thereof. Thus, the thickness of the light shielding layer itself and the slope angle at the edge of the pattern will affect the crystallization effect of the subsequent polysilicon.

Figure 1:
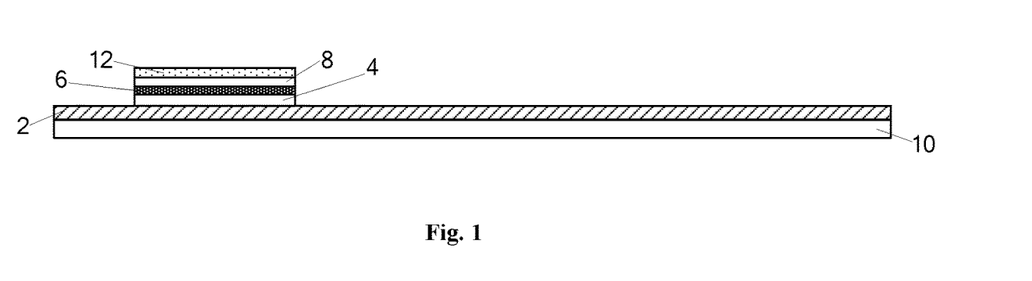
FIG. 1 is a schematic partial cross-sectional view of a display substrate assembly according to an embodiment of the present disclosure.

FIG. 1 shows a schematic partial view of a display substrate assembly according to an embodiment of the present disclosure. In one example, the display substrate assembly may be an array substrate. The display substrate assembly may include a base substrate 10, a light shielding layer 6 on the base substrate 10, and an active layer 12 of a thin film transistor above the base substrate 10. As shown in FIG. 1, on the base substrate 10, the light shielding layer 6 and the active layer 12 correspond to each other in position to block the irradiation on the active layer from external light. In one example, an orthographic projection of the active layer 12 on the base substrate 10 in a direction perpendicular to a main surface of the base substrate (i.e., the thickness direction of the base substrate) is within an orthographic projection of the light shielding layer 6 on the base substrate 10 in this direction. In another example, the orthographic projections of the active layer 12 and the light shielding layer 6 on the base substrate 10 in the direction perpendicular to the main surface of the base substrate (i.e., the thickness direction of the base substrate) completely overlap. In this manner, the light shielding layer 6 can prevent the light from the backlight source from irradiating the region of back channel in the active layer of the TFT, thereby avoiding the leakage current caused due to the strong light of the backlight source directly irradiating the back channel.

In some exemplary embodiments, as shown in FIG. 1, the display substrate assembly may further include: a buffer layer 2 on the base substrate 10; a first insulating layer 4 on the buffer layer 2; and a second insulating layer 8 on the light shielding layer 6. In addition, the light shielding layer 6 is on the first insulating layer 4, that is, the light shielding layer 6 is located between the first insulating layer 4 and the second insulating layer 8, and the active layer 12 is on the second insulating layer 8, that is, the second insulating layer 8 is located between the light shielding layer 6 and the active layer 12. In other words, the buffer layer 2, the first insulating layer 4, the light shielding layer 6, the second insulating layer 8, and the active layer 12 are sequentially stacked on the base substrate 10 from the bottom to the top.

According to an embodiment of the present disclosure, the light shielding layer 6 is formed of amorphous silicon (a-Si). In this way, in the embodiment of the present disclosure, the active layer and the corresponding light shielding layer can be formed using only the same mask (i.e., by one patterning process). Compared with the technique of forming a light shielding layer by using a metal under the active layer and additionally using a mask, one masking process can be reduced, thereby simplifying the method of manufacturing the display substrate assembly. The manufacturing process for forming the active layer and the light shielding layer by one patterning process will be described in detail hereinafter.

For the above solutions of forming the light shielding layer by using an amorphous silicon material layer, the inventor(s) has further studied the light shielding characteristics of the amorphous silicon material layer from different aspects through experiments.

Figure 2:
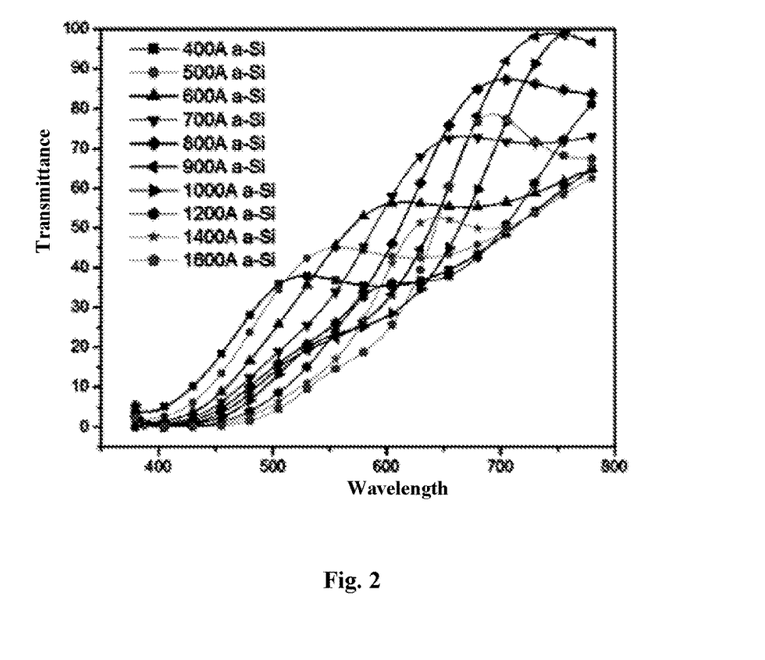
FIG. 2 is a graph showing light shielding characteristics of light shielding layers having different thicknesses for lights of different wavelength ranges.

FIG. 2 shows light shielding characteristics of light shielding layers having different thicknesses. As shown in FIG. 2, the horizontal ordinate represents a wavelength of light, and the vertical ordinate represents a transmittance of light through the light shielding layer 6. In the embodiment shown in FIG. 2, it shows transmittance curves of these light shielding layers having the thicknesses of 400 Å (angstrom), 500 Å, 600 Å, 700 Å, 800 Å, 900 Å, 1000 Å, 1200 Å, 1400 Å, and 1600 Å, respectively.

Generally, spectral distribution of visible lights is shown in the Table below. Since the light emitted by the backlight source is mainly visible light, the embodiment shown in FIG. 2 mainly shows transmission characteristics of the light shielding layers having different thicknesses to visible light.

TABLE 1

| spectral distribution of visible lights | |
|---|---|
| spectral color of visible lights | wavelength range (Nanometer) |
| Red (R) | about 625 nm~about 740 nm |
| Orange | about 590 nm~about 625 nm |
| Yellow | about 565 nm~about 590 nm |
| Green (G) | about 500 nm~about 565 nm |
| Cyan | about 485 nm~about 500 nm |
| Blue (B) | about 440 nm~about 485 nm |
| Purple | about 380 nm~about 440 nm |

In the display substrate assembly, usually a blue light is an excitation light. Therefore, in the embodiments of the present disclosure, when designing the thickness of the light shielding layer 6, transmission characteristics of the light shielding layers having different thicknesses to blue light (namely, light within a short wavelength range) are firstly considered. Thus, according to transmittance curves shown in FIG. 2, in the embodiments of the present disclosure, the thickness of the light shielding layer 6 may be set within the range of 500 Å~1600 Å. More preferably, the thickness of the light shielding layer 6 may be set within the range of 900 Å~1600 Å, which ensures that the light shielding layer 6 has a low transmittance to light (especially blue light) emitted by the backlight source.

Figure 3:
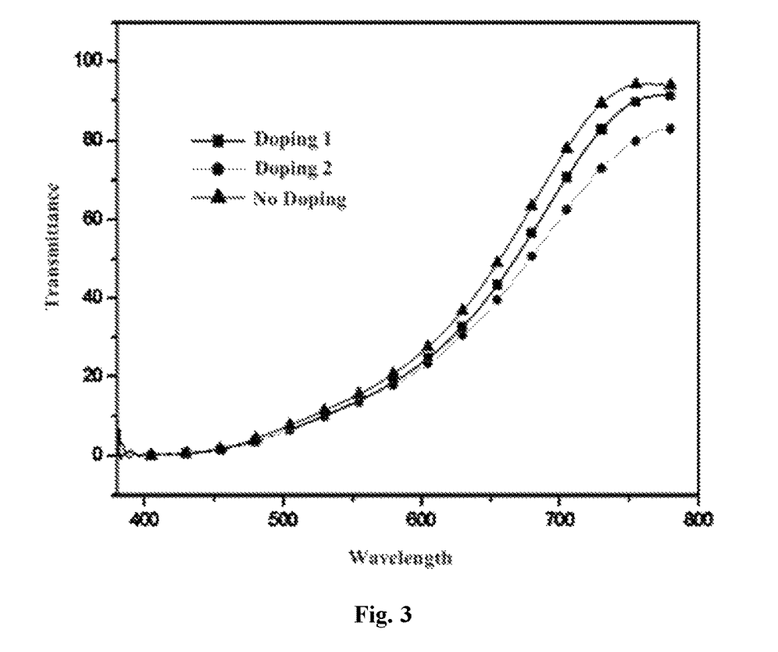
FIG. 3 is a graph showing effects of ion dopings on the light shielding characteristics of light shielding layers for lights of different wavelength ranges.

According to a further embodiment of the present disclosure, the light shielding layer 6 may be formed of an ion-doped amorphous silicon layer, that is, the light shielding layer 6 may comprise an ion-doped amorphous silicon layer. In one example, the light shielding layer 6 may be formed of an amorphous silicon layer doped with boron ions (B3+) or phosphorus ions (P3+). FIG. 3 shows effects of ion dopings on the light shielding characteristics of the light shielding layers. It can be seen from FIG. 3, when the light shielding layer is not doped with ions, the light shielding layer has a relatively high transmittance of visible light within the medium and long wavelength ranges, that is, the light shielding effect is not good; while, when the light shielding layer is doped with ions of different concentrations (for example, doping 1 represents the light shielding layer doped with boron ions of a certain concentration, doping 2 represents the light shielding layer doped with phosphorus ions of a certain concentration), the light shielding layer has a reduced transmittance of visible light within the medium and long wavelength ranges. It has been found by experimental study that, the ion-doped amorphous silicon layer can reduce the transmittance of visible light within the medium and long wavelength ranges from 580 nm to 780 nm by about 6%~10%. The main reason is that, doping the amorphous silicon by ion implantation or the like introduces an impurity level in the band gap, which is equivalent to reducing the optical band gap of the amorphous silicon, that is, light having a wavelength greater than 580 nm (small energy) can be easily absorbed, and therefore, the ion-doped amorphous silicon has enhanced absorption of light having a wavelength of 580 nm or more, resulting in decreased light transmittance. That is, when the light shielding layer is formed of the ion-doped amorphous silicon layer, the light shielding effect of the light shielding layer can be further improved, and in particular, the light shielding effect of the light shielding layer on the visible light within the medium and long wavelength ranges can be improved.

According to an embodiment of the present disclosure, the active layer 12 may be formed of polysilicon material (p-Si, especially low temperature polysilicon (LTPS) material). Generally, manufacturing process of an LTPS thin film transistor is relatively complicated, and generally requires 9 to 11 patterning processes. Moreover, for the LPTS thin film transistor (TFT), it generally has two structures, namely a bottom gate structure and a top gate structure, but the top gate structure is superior to the bottom gate structure in some basic performances such as mobility, threshold voltage, and S value (sub-threshold slope). So the top gate structure is the mainstream structure of the LTPS TFT. For TFT of a top-gate structure, a light shielding layer is generally required to prevent a strong light emitted from the backlight source from directly irradiating the back channel to generate a leakage current. In this way, when the above configuration according to the embodiments of the present disclosure is applied to an LTPS TFT, not only the manufacturing process of the LTPS TFT can be simplified, but also the operating performance of the LTPS TFT can be better improved. Moreover, in the process of manufacturing the LTPS TFT, a light shielding layer is generally formed by one patterning process, and then an active layer is formed by another patterning process, and a certain slope angle is formed at the edge of the light shielding layer formed in the former patterning process. In this case, the thickness of the light shielding layer itself and the slope angle at its edge will affect the crystallization effect of subsequent polysilicon. In the embodiment of the present disclosure, the light shielding layer and the active layer are formed by one patterning process, and there is no such situation that affects the crystallization effect. Therefore, the manufacturing method according to the embodiments of the present disclosure can also improve the crystallization effect of the polysilicon in the LTPS TFT.

According to an embodiment of the present disclosure, the buffer layer 2 may be formed of silicon nitride. In this way, the buffer layer 2 formed of silicon nitride can block ions (for example, Na+, etc.) in the base substrate 10 from entering the layers above the buffer layer 2. In one example, the first insulating layer 4 and the second insulating layer 8 may be formed of a material having the same or approximately the same etching rate. In one example, the first insulating layer 4 and the second insulating layer 8 may be formed of silicon oxide. By using the first insulating layer and the second insulating layer formed of a material having the same or approximately the same etching rate, the etching rates of the two layers can be controlled to be the same or approximately the same, so as to adjust the slope angle of one etching, thereby avoiding occurrence of a poor structure such as an inverted trapezoid. In one example, the thickness of the buffer layer 2 may be 200 Å-1000 Å, the thickness of the first insulating layer 4 may be 500 Å-3000 Å, and the thickness of the second insulating layer 8 may be 1000 Å-4000 Å. By matching the materials and thicknesses of the buffer layer, the first insulation layer and the second insulation layer, the etch rate of each layer can be matched while minimizing the etching difficulty, avoiding occurrence of a poor structure such as an inverted trapezoid, and ensuring a good crystallization effect is achieved when the subsequent a-Si is converted into p-Si. In one example, the buffer layer 2 may be formed of silicon nitride, and the first insulating layer 4 and the second insulating layer 8 may be formed of silicon oxide. By such a combination of materials, it can be ensured that a good crystallization effect is achieved when the subsequent a-Si is converted into p-Si.

Figure 4:
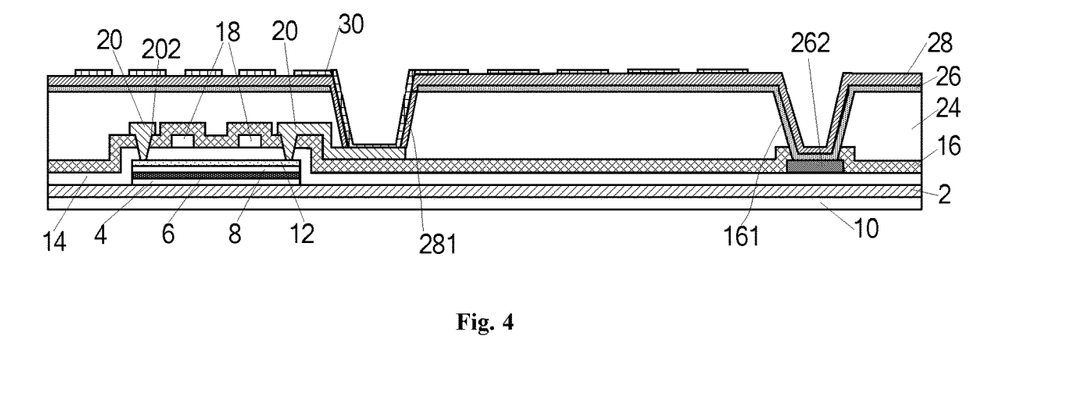
FIG. 4 is a schematic cross-sectional view of a display substrate assembly according to an embodiment of the present disclosure.

FIG. 4 shows a schematic diagram of a display substrate assembly according to an embodiment of the present disclosure. As shown in FIG. 4, the display substrate assembly includes: a base substrate 10; a buffer layer 2 on the base substrate 10; a first insulating layer 4 on the buffer layer 2; a light shielding layer 6 on the first insulating layer 4; a second insulating layer 8 on the light shielding layer 6; an active layer 12 on the second insulating layer 8; a gate insulating layer 14 overlying the active layer 12; a gate electrode 18 on the gate insulating layer 14 and a connection sub-electrode 262 electrically connected to a common electrode; an interlayer dielectric layer 16 formed on the base substrate and overlying the gate electrode 18 and the connection sub-electrode 262; source and drain electrodes 20 on the interlayer dielectric layer 16 and electrically connected to the active layer 12 through the via hole 202 formed in the interlayer dielectric layer 16; a planarization layer 24 on the source and drain electrodes 20 and the interlayer dielectric layer 16, the common electrode 26 on the planarization layer 24 and electrically connected to the connection sub-electrode 262 through the via hole 161 formed in the interlayer dielectric layer 16; a passivation layer 28 on the common electrode 26; and a pixel electrode 30 on the passivation layer 28 and electrically connected to the drain electrode 20 through the via 281 formed in the passivation layer 28.

In some embodiments, the active layer 12 may be formed of low temperature polysilicon. In the embodiment shown in FIG. 4, one TFT of the display substrate assembly includes two gates 18, that is, it forms a double gate structure. However, FIG. 4 only shows the overall structure of a display substrate assembly according to an embodiment of the present disclosure, but is not used to limit the present disclosure. It can be understood that the display substrate assembly according to embodiments of the present disclosure may also have other structures.

Figure 5:
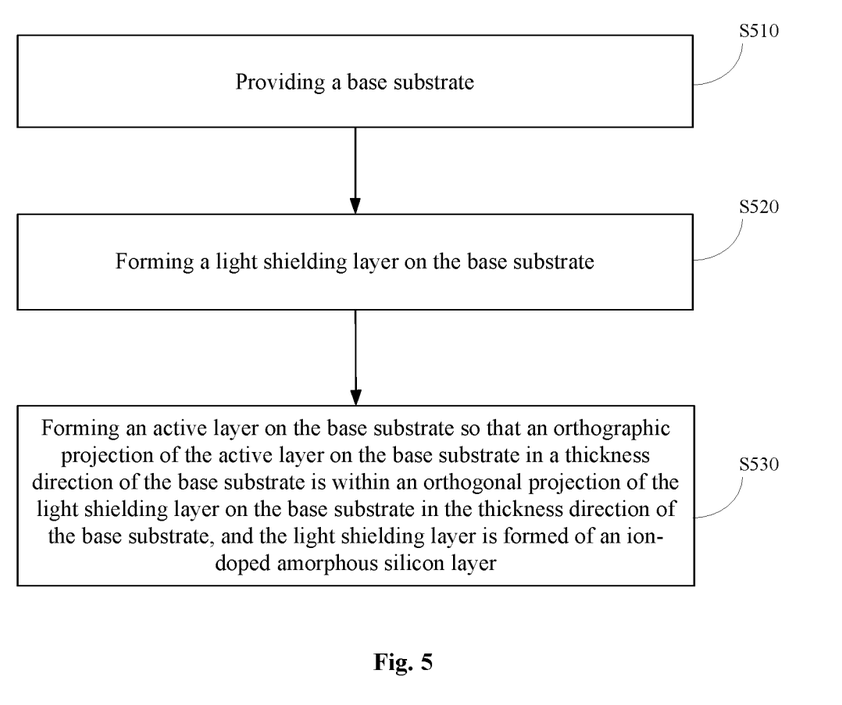
FIG. 5 is a flowchart of a method of manufacturing a display substrate assembly according to an embodiment of the present disclosure.

According to an embodiment of the present disclosure, a method of manufacturing a display substrate assembly is also provided, as shown in FIG. 5. In a step S510, a base substrate is provided. For example, the base substrate may be a glass substrate or other transparent substrate. In a step S520, a light shielding layer is formed on the base substrate. As described above, the light shielding layer may be formed of an ion-doped amorphous silicon layer. In a step S530, an active layer is formed above the base substrate, the light shielding layer corresponds in position to the active layer on the base substrate. For example, an orthographic projection of the active layer on the base substrate is located within an orthographic projection of the light shielding layer on the base substrate, or the two coincide. The active layer may be formed of polysilicon.

Figure 6:
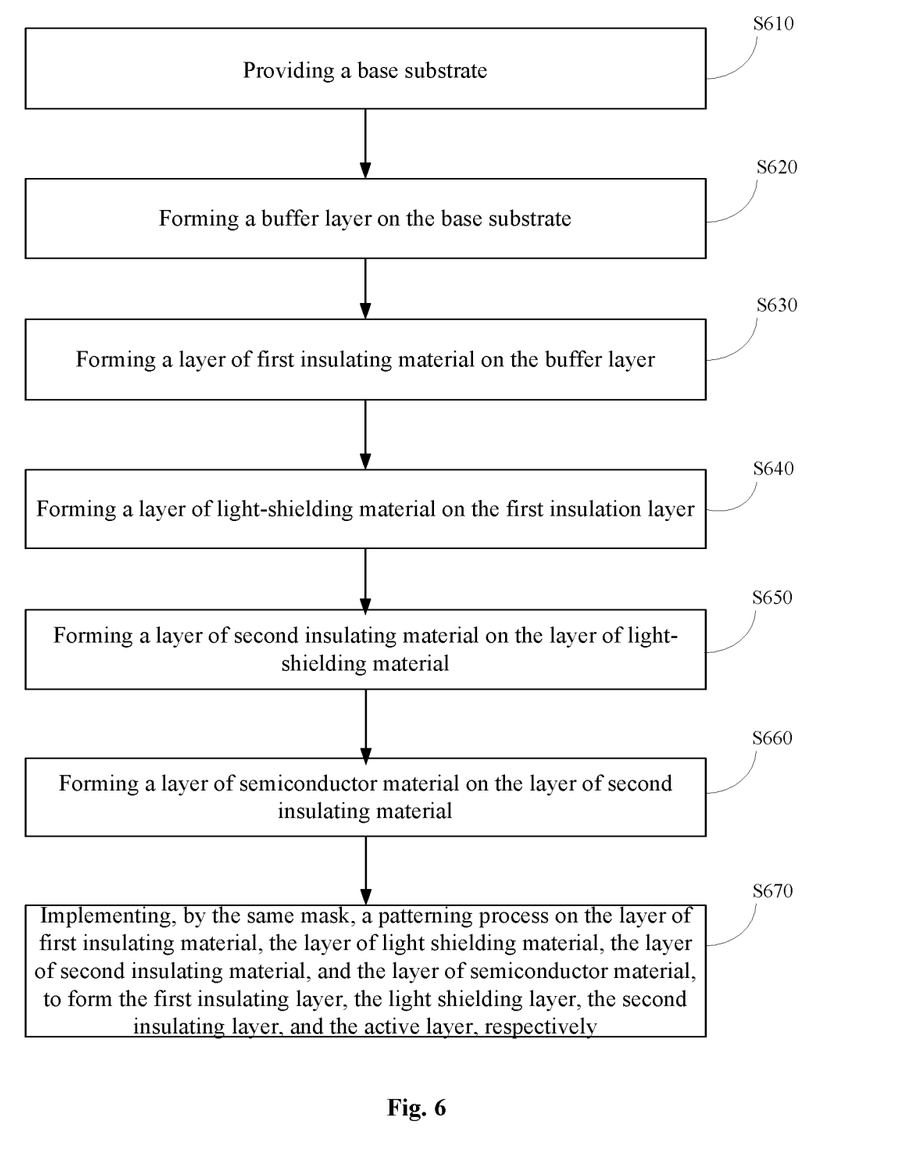
FIG. 6 is a flowchart of a method of manufacturing a display substrate assembly according to another embodiment of the present disclosure.

According to an embodiment of the present disclosure, a method for manufacturing a display substrate assembly is also provided, as shown in FIG. 6. In a step S610, a base substrate is provided. In a step S620, a buffer layer is formed on the base substrate. In a step S630, a layer of first insulating material is formed on the buffer layer. In a step S640, a layer of light-shielding material is formed on the first insulation layer, and the layer of light-shielding material may be formed of amorphous silicon or ion-doped amorphous silicon. In a step S650, a layer of second insulating material is formed on the layer of light-shielding material. In a step S660, a layer of semiconductor material is formed on the layer of second insulating material, and the layer of semiconductor material may be formed of polysilicon that is converted from amorphous silicon. In a step S670, the layer of first insulating material, the layer of light shielding material, the layer of second insulating material, and the layer of semiconductor material are treated by the same mask to form the first insulating layer, the light shielding layer, the second insulating layer, and the active layer, respectively. Since, in the embodiments of the present disclosure, the light shielding layer may be formed of amorphous silicon (a-Si), patterns of the active layer and the light shielding layer can be formed using the same mask (namely, by a single patterning process). Compared with the technique of forming a light shielding layer by using a metal under the active layer and additionally using the same mask, one masking process can be saved, thereby simplifying the method of manufacturing the display substrate assembly. Moreover, in the existing manufacturing process, a light shielding layer is formed by one patterning process, and then an active layer is formed by another patterning process, and a certain slope angle is formed at the edge of a pattern of the light shielding layer formed in the former patterning process. In this case, the thickness of the light shielding layer itself and the slope angle at the edge of the pattern will affect the crystallization effect of subsequent polysilicon. In the embodiments of the present disclosure, the light shielding layer and the active layer are formed with the same mask, and there is no such situation that affects the crystallization effect. Therefore, the manufacturing method according to the embodiments of the present disclosure can also improve the crystallization effect of the polysilicon.

Hereinafter, a method of manufacturing a display substrate assembly according to an embodiment of the present disclosure will be described in detail with reference to FIG. 7 that shows a structure of the display substrate assembly formed in an exemplary step.

Figure 7:
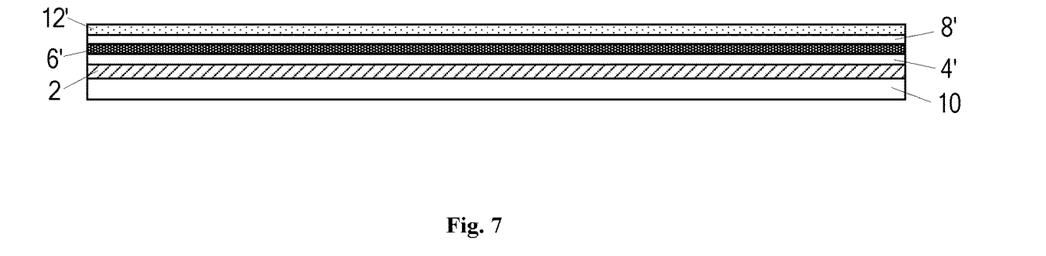
FIG. 7 is a schematic cross-sectional view illustrating a structure formed by several steps of a method of manufacturing a display substrate assembly according to an embodiment of the present disclosure.

As shown in FIG. 7, a buffer layer 2, a layer of first insulating material 4', a first amorphous silicon layer 6', a layer of second insulating material 8', and a second amorphous silicon layer 12' are sequentially formed on a base substrate 10 from the bottom to the top. Here, the buffer layer 2 may be formed of silicon nitride (SiNx), and one or both of the layer of the first insulating material 4' and the layer of the second insulating material 8' may be formed of silicon oxide (SiO2). In one example, the abovementioned layers may be formed on the base substrate 10 by deposition.

Then, ion implantation is performed on the first amorphous silicon layer 6' to form a light shielding layer. In one example, boron ions or phosphorus ions may be implanted into the first amorphous silicon layer or into the interface between the first amorphous silicon layer and the layer of first insulating material 4' by adjusting ion implantation concentration, energy, and other parameters of the ion implantation apparatus. Subsequently, the substrate formed with the ion-implanted first amorphous silicon layer is annealed, for example using a rapid annealing furnace. It has been found by experiments that, when the ion implantation process parameters of the ion implantation apparatus are: voltage of 30 KV, injection concentration/dose of 5E14~9E14 (namely, $5\times10^{14}$~$9\times10^{14}$), the light shielding layer can have a better ion (e.g., boron or phosphorus ions) doping concentration, so as to achieve a better light shielding effect. It should be noted that the present disclosure is not limited to the use of an ion implantation process to form the light shielding layer. In other embodiments, other processes, such as a CVD doping process, may also be used to dope ions into the first amorphous silicon layer. Thus, the light shielding layer according to the embodiments of the present disclosure is formed.

Then, the second amorphous silicon layer 12' is annealed to convert the second amorphous silicon layer 12' into a polysilicon layer, for subsequent formation of the active layer.

Finally, the layer of first insulating material 4', the first amorphous silicon layer 6' with implanted ions, the layer of second insulating material 8, and the second amorphous silicon layer 12' are processed by using the same mask to respectively form the first insulating layer 4, the light shielding layer 6, the second insulating layer 8, and the active layer 12 shown in FIG. 1.

Figure 8:
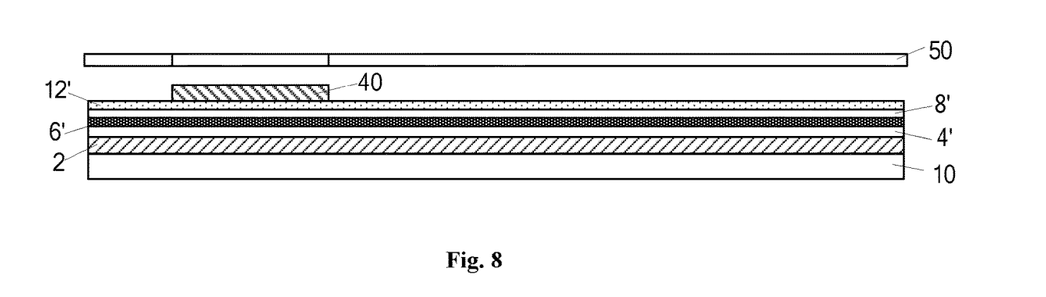
FIG. 8 is a schematic cross-sectional view illustrating a structure formed by another step of a method of manufacturing a display substrate assembly according to an embodiment of the present disclosure.

In one embodiment, the step of forming the first insulating layer, the light shielding layer, the second insulating layer, and the active layer using the same mask can include:

forming a pattern of photoresist 40 on the second amorphous silicon layer 12' through a mask plate 50, as shown in FIG. 8;

etching, by using an etching process with the pattern of photoresist 40 as a mask, the layer of first insulating material 4', the first amorphous silicon layer 6', the layer of second insulating material 8', and the second amorphous silicon layer 12', to respectively form the first insulating layer 4, the light shielding layer 6, the second insulating layer 8, and the active layer 12 (as shown in FIG. 1); and stripping off the photoresist 40.

In the above embodiment, since the etching processes performed on the layer of first insulating material, the layer of light-shielding material or the first amorphous silicon layer, the layer of second insulation material, and the layer of semiconductor material or the second amorphous silicon layer are performed on the basis of the formed pattern of the photoresist or using the formed pattern of the photoresist as a mask, it is possible to complete the patterning processes of the layer of first insulating material, the layer of light-shielding material or the first amorphous silicon layer, the layer of second insulating material, and the layer of semiconductor material or the second amorphous silicon layer, by using a mask corresponding to the photoresist-formed mask.

According to embodiments of the present disclosure, after the first insulating layer, the light shielding layer, the second insulating layer and the active layer are formed by using the same mask, patterns of a gate electrode, an interlayer dielectric layer, source and drain electrodes, a planarization layer, a common electrode, a passivation layer, and a pixel electrode shown in FIG. 4 may also be sequentially formed by using a patterning process, and the process of forming the patterns of the layers may be a conventional patterning process, which will not be described herein.

It should be noted that, although the light shielding layer is formed below the active layer in the above exemplary embodiments, in other embodiments, the light shielding layer may also be formed above the active layer. For example, the light shielding layer may be formed above the TFT structure including the active layer, or the light shielding layers may be formed both above and below the active layer at the same time, respectively.

In the display substrate assembly and the method of manufacturing the same according to the embodiments of the present disclosure, the active layer and the corresponding light shielding layer may be formed by using the same mask (namely, through one patterning process). Compared with the technique of forming a light shielding layer by using a metal under the active layer and additionally using a mask, one masking process can be saved, thereby simplifying the method of manufacturing the display substrate assembly and saving the manufacturing cost, and at the same time, guaranteeing crystallization effect of the amorphous silicon converted into the polysilicon in the subsequent process. In addition, the light shielding layer formed by the ion-doped amorphous silicon layer can further improve the light shielding effect of the light shielding layer.

According to another embodiment of the present disclosure, there is also provided a display apparatus including the display substrate assembly described in any one of the embodiments of the present disclosure. Exemplarily, the display apparatus may be any product or component having a display function, such as a display panel, an electronic paper, a mobile phone, a tablet computer, a television, a notebook computer, a digital photo frame, a navigator, and the like.

Although some embodiments of the general inventive concept of the present disclosure have been shown and described, it will be apparent, however, for those skilled in the art that changes on these embodiments may be made without departing from the principles and spirit of the general inventive concept of the present disclosure, the scope of which is defined in the claims and their equivalents.

What is claimed is:

1. A display substrate assembly, comprising:
a base substrate;
a light shielding layer on the base substrate; and
an active layer of a thin film transistor, above the base substrate;
wherein an orthographic projection of the active layer on the base substrate in a thickness direction of the base substrate is within an orthographic projection of the light shielding layer on the base substrate in the thickness direction of the base substrate, and the light shielding layer comprises an amorphous silicon layer doped with boron ions or phosphorus ions with a doping concentration of $5\times10^{14}$ to $9\times10^{14}$ cm$^{-2}$.

2. The display substrate assembly of claim 1, further comprising:
a buffer layer on the base substrate;
a first insulating layer on the buffer layer; and
a second insulating layer on the light shielding layer;
wherein, the light shielding layer is between the first insulating layer and the second insulating layer, and the second insulating layer is between the light shielding layer and the active layer.

3. The display substrate assembly of claim 2, wherein orthogonal projections of the active layer, the first insulating layer, the light shielding layer and the second insulating layer on the base substrate in the thickness direction of the base substrate are completely overlapped.

4. The display substrate assembly of claim 2, wherein the buffer layer, the first insulating layer, the light shielding layer, the second insulating layer and the active layer are stacked on the base substrate in that order from the bottom to the top.

5. The display substrate assembly of claim 2, wherein the buffer layer comprises silicon nitride material.

6. The display substrate assembly of claim 2, wherein the buffer layer has a thickness of 200 Å to 1000 Å.

7. The display substrate assembly of claim 2, wherein the first insulating layer and the second insulating layer comprise silicon oxide material.

8. The display substrate assembly of claim 2, wherein the first insulating layer has a thickness of 500 Å to 3000 Å, and the second insulating layer has a thickness of 1000 Å to 4000 Å.

9. The display substrate assembly of claim 1, wherein the light shielding layer has a thickness of 500 Å to 1600 Å.

10. The display substrate assembly of claim 1, wherein the active layer comprises polysilicon material.

11. A display apparatus comprising the display substrate assembly of claim 1.

12. A method of manufacturing a display substrate assembly, the method comprising:
providing a base substrate; and
forming an active layer of a thin film transistor and a light shielding layer above the base substrate so that an orthographic projection of the active layer on the base substrate in a thickness direction of the base substrate is within an orthogonal projection of the light shielding layer on the base substrate in the thickness direction of the base substrate, and the light shielding layer is formed of an ion-doped amorphous silicon layer,
wherein the light shielding layer comprises an amorphous silicon layer doped with boron ions or phosphorus ions with a doping concentration of $5\times10^{14}$ to $9\times10^{14}$ cm$^{-2}$.

13. The method of claim 12, further comprising:
forming a buffer layer, a layer of first insulating material, a layer of second insulating material and a layer of semiconductor material, on the base substrate; and
patterning, with one mask, the layer of first insulating material, the ion-doped amorphous silicon layer, the layer of second insulating material and the layer of semiconductor material, to form a first insulating layer, the light shielding layer, a second insulating layer and the active layer, respectively.

14. The method of claim 13, wherein the step of forming a buffer layer, a layer of first insulating material, the light shielding layer, a layer of second insulating material and a layer of semiconductor material, on the base substrate, comprises:
forming the buffer layer on the base substrate;
forming the layer of first insulating material on the buffer layer;
forming a first amorphous silicon layer on the layer of first insulating material;
forming the layer of second insulating material on the first amorphous silicon layer;
forming a second amorphous silicon layer on the layer of second insulating material;
implementing an ion doping on the first amorphous silicon layer, and annealing the first ion-doped amorphous silicon layer, to form the light shielding layer; and
annealing the second amorphous silicon layer to convert the second amorphous silicon layer into a polysilicon layer as the layer of semiconductor material.

15. The method of claim 14, wherein the step of patterning, with one mask, the layer of first insulating material, the ion-doped amorphous silicon layer, the layer of second insulating material and the layer of semiconductor material, comprises:
forming a pattern of photoresist on the layer of semiconductor material with the one mask;
etching, by using the pattern of photoresist as a mask in an etching process, the layer of first insulating material, the ion-doped amorphous silicon layer, the layer of second insulating material, and the layer of semiconductor material, to form the first insulating layer, the light shielding layer, the second insulating layer, and the active layer, respectively; and stripping off the photoresist.

16. The method of claim 15, wherein, when the layer of first insulating material and the layer of second insulating material are etched, etch rates of the layer of first insulating material and the layer of second insulating material are approximately the same.

17. The method of claim 14, wherein, the step of implementing an ion doping on the first amorphous silicon layer, comprises:

implanting, by adopting ion implantation process parameters including a voltage of 30 KV and an ion implantation dose of 5E14 to 9E14, boron ions or phosphorus ions into the first amorphous silicon layer.

18. The method of claim 14, wherein, the layer of first insulating material and the layer of second insulating material are formed of silicon oxide.

19. The method of claim 13, wherein, the buffer layer is formed of silicon nitride.

* * * * *